(12) United States Patent
Liu et al.

(10) Patent No.: US 12,148,834 B2
(45) Date of Patent: Nov. 19, 2024

(54) FinFET STRUCTURE HAVING A GATE CONTACT ABOVE A METAL GATE AND STRADDLING THE BOUNDARY OF AN ACTIVE REGION

(71) Applicant: Huawei Technologies Co., Ltd., Shenzhen (CN)

(72) Inventors: Xinfang Liu, Shenzhen (CN); Miao Xu, Shanghai (CN); Yanxiang Liu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 367 days.

(21) Appl. No.: 17/226,563

(22) Filed: Apr. 9, 2021

(65) Prior Publication Data

US 2021/0257494 A1 Aug. 19, 2021

Related U.S. Application Data

(63) Continuation of application No. PCT/CN2018/109671, filed on Oct. 10, 2018.

(51) Int. Cl.
*H01L 29/78* (2006.01)
*H01L 21/28* (2006.01)
(Continued)

(52) U.S. Cl.
CPC .... *H01L 29/7851* (2013.01); *H01L 21/28123* (2013.01); *H01L 21/76834* (2013.01);
(Continued)

(58) Field of Classification Search
CPC ..... H01L 21/823431; H01L 21/823821; H01L 21/845; H01L 27/0886; H01L 27/0924; H01L 27/1211; H01L 27/10826; H01L 27/10879; H01L 29/41791; H01L 29/66795–66818; H01L 29/785–7856; H01L 2029/7857–7858; H01L 2924/13067; H01L 23/528; H01L 23/5283; H01L 23/5221; H01L 23/5226; H01L 23/535; H01L 23/481; H01L 23/485; H01L 23/4855; H01L 21/823475; H01L 21/823871; H01L 21/76895; H01L 21/76877; H01L 21/76816; H01L 21/76804; H01L 29/41775;
(Continued)

(56) References Cited

U.S. PATENT DOCUMENTS 8,664,729 B2 3/2014 Jou et al.
8,759,181 B2 6/2014 Jou et al.
(Continued)

FOREIGN PATENT DOCUMENTS

CN 101996874 A 3/2011
CN 103325831 A 9/2013
(Continued)

*Primary Examiner* — Younes Boulghassoul
(74) *Attorney, Agent, or Firm* — Conley Rose, P.C.

(57) ABSTRACT

A field-effect transistor structure includes a semiconductor substrate, a metal gate, a metal trench for source, a metal trench for drain, an etching-stop layer, and a gate contact. The etching-stop layer is overlaid on the metal trench for source and the metal trench for drain. The gate contact is above an active region.

20 Claims, 12 Drawing Sheets

(51) Int. Cl.
*H01L 21/768* (2006.01)
*H01L 21/8234* (2006.01)
*H01L 27/088* (2006.01)
*H01L 29/08* (2006.01)
*H01L 29/49* (2006.01)
*H01L 29/66* (2006.01)

(52) U.S. Cl.
CPC ............ *H01L 21/76897* (2013.01); *H01L 21/823431* (2013.01); *H01L 21/823475* (2013.01); *H01L 27/0886* (2013.01); *H01L 29/0847* (2013.01); *H01L 29/4983* (2013.01); *H01L 29/66636* (2013.01); *H01L 29/66795* (2013.01); *H01L 29/785* (2013.01); *H01L 29/4966* (2013.01)

(58) Field of Classification Search
CPC ........... H01L 29/41725; H01L 29/4232; H01L 21/76829; H01L 21/76834; H01L 29/78696; H01L 29/42392; H01L 29/0673; H01L 29/66439; H01L 29/775; H01L 23/5286; H01L 23/5384; H01L 23/5386; H01L 21/76897; H01L 21/28123; H01L 21/823418; H01L 21/823814; H01L 21/823425; H01L 29/0847; H01L 29/7848; H01L 29/66636; H01L 29/66575; H01L 29/41733; H01L 29/4175; H01L 29/41766; H01L 29/41783; H01L 21/76831
See application file for complete search history.

(56) References Cited

U.S. PATENT DOCUMENTS

| | | | |
|---|---|---|---|
| 2011/0042752 A1* | 2/2011 | Mayuzumi | H01L 21/2855 257/E21.409 |
| 2013/0187228 A1 | 7/2013 | Xie et al. | |
| 2013/0248948 A1 | 9/2013 | Ma et al. | |
| 2015/0035065 A1* | 2/2015 | Park | H01L 27/105 257/773 |
| 2016/0268244 A1* | 9/2016 | Young | G06F 30/394 |
| 2017/0194211 A1 | 7/2017 | Lai et al. | |
| 2018/0096934 A1 | 4/2018 | Siew et al. | |
| 2018/0102364 A1* | 4/2018 | Rastogi | H01L 29/4966 |
| 2018/0211874 A1 | 7/2018 | Basker et al. | |
| 2018/0211875 A1* | 7/2018 | Basker | H01L 29/66795 |
| 2018/0261546 A1* | 9/2018 | Bark | H01L 23/5226 |
| 2019/0006515 A1* | 1/2019 | Cheng | H01L 21/76877 |
| 2019/0393318 A1* | 12/2019 | Chung | H01L 21/76834 |
| 2020/0013871 A1* | 1/2020 | An | H01L 29/516 |
| 2020/0058757 A1* | 2/2020 | Xie | H01L 21/823431 |
| 2020/0066597 A1* | 2/2020 | Cheng | H01L 29/41791 |

FOREIGN PATENT DOCUMENTS

| | | |
|---|---|---|
| CN | 103390637 A | 11/2013 |
| CN | 104241359 A | 12/2014 |
| CN | 106935510 A | 7/2017 |
| CN | 107919357 A | 4/2018 |
| WO | 2016160120 A1 | 10/2016 |

* cited by examiner

FinFET STRUCTURE HAVING A GATE CONTACT ABOVE A METAL GATE AND STRADDLING THE BOUNDARY OF AN ACTIVE REGION

CROSS-REFERENCE TO RELATED APPLICATIONS

This application is a continuation of International Patent Application No. PCT/CN2018/109671 filed on Oct. 10, 2018, the disclosure of which is hereby incorporated by reference in its entirety.

TECHNICAL FIELD

This application relates to the field of semiconductor technologies, and in particular, to a field-effect transistor with low gate resistance and a manufacturing method thereof.

BACKGROUND

As a semiconductor device is highly integrated and a size of an integrated circuit is continuously reduced, a gate length of a field-effect transistor device is continuously reduced. In addition, a structure of a complementary metal-oxide-semiconductor (CMOS) device evolves from a conventional planar device to a three-dimensional fin field-effect transistor (FinFET) structure. This three-dimensional structure further reduces the gate length of the transistor.

Continuous reduction in the gate length of the field-effect transistor device leads to a sharp increase in gate resistance, in other words, leads to an increase in a resistance-capacitance product between the gate resistance and capacitance. This increases a delay of a circuit, seriously deteriorating high-frequency performance of the device, and increasing difficulty of designing a high-frequency circuit. It is crucial to reduce the gate resistance to improve the high-frequency performance of the field-effect transistor.

SUMMARY

Embodiments of this application provide a field-effect transistor structure, to effectively reduce gate resistance.

A first aspect of this application provides a field-effect transistor structure. The structure includes a semiconductor substrate, a metal gate, a metal trench for source, a metal trench for drain, an etching-stop layer stopper, and a gate contact. The metal gate is located above the semiconductor substrate. The metal trench for source and the metal trench for drain are located on two sides of the metal gate. The etching-stop layer is overlaid on the metal trench for source and the metal trench for drain. The gate contact is located above the metal gate, and the gate contact is at least partially above an active region.

In the field-effect transistor structure provided in this application, because an etching-stop layer is overlaid on the metal trench for source and the metal trench for drain, the gate contact may be accurately formed on the gate without short-circuiting the metal trench for source or the metal trench for drain. Therefore, the gate contact may extend to an upper part of the active region on the metal gate. In this way, limitation on the length of the gate contact is reduced, and a shape of the gate contact may be similar to that of the metal gate in a long strip shape. This increases a contact area between the gate contact and the metal gate, and greatly reduces gate resistance.

In a possible implementation, the structure further includes a semiconductor fin, the semiconductor fin is located above the semiconductor substrate. The semiconductor fin and the metal gate are arranged in a cross manner, and the semiconductor fin passes through the metal gate.

In a possible implementation, there are a plurality of semiconductor fins, the structure further includes an isolation layer, and the plurality of semiconductor fins are separated by the isolation layer.

In a possible implementation, the active region is a region enclosed by the metal trench for source and the metal trench for drain. A part in which the metal gate and the semiconductor fin intersect is located in the active region.

In a possible implementation, the gate contact extends along a width direction of the metal gate. A width of an end face that is of the gate contact and that is directly adjacent to the metal gate is equal to the length of the metal gate. The length of the gate contact is greater than the length of the metal gate and is less than a width of the metal gate.

In the FinFET structure provided in this application, the length of the gate contact may be the same as the width of the metal gate at a maximum length. A larger contact area between the gate contact and the gate indicates smaller contact resistance. When the length of the gate contact is the same as the width of the metal gate, a contact area is the largest. In this case, contact resistance is the smallest, and corresponding gate resistance is also the smallest.

In a possible implementation, the structure further includes a spacer. The spacer is located between the metal trench for source and the metal gate, and between the metal trench for drain and the metal gate.

There is the spacer between the metal trench for source and the metal gate, and between the metal trench for drain and the metal gate, to avoid a short circuit between the gate and a source, and between the gate and a drain.

In a possible implementation, the structure further includes the source and the drain. The source and the drain are separately located in the semiconductor fins on the two sides of the metal gate. The metal trench for source is located above the source and is connected to the source, and the metal trench for drain is located above the drain and is connected to the drain.

In a possible implementation, the structure further includes a metal belt. The metal belt is located above the gate contact and is connected to the metal gate by using the gate contact. The metal belt extends along a length direction of the fin.

In the FinFET structure provided in this application, the metal belt is placed above the gate contact. The gate resistance is equivalent to parallel resistance of metal gate resistance, gate contact resistance and metal belt resistance. The metal belt is laid above to further reduce the equivalent resistance of the gate. The metal belt extends along the length direction of the fin, and that an external device is connected to the metal belt is equivalent to that the external device is connected to the metal gate. This facilitates cabling.

In a possible implementation, a top end face of the spacer and a top end face of the etching-stop layer are at a same height, and the metal belt is located above the spacer and the etching-stop layer. The etching-stop layer is configured to isolate the metal belt from the metal trench for source and isolate the metal belt from the metal trench for drain.

In a possible implementation, the gate contact is in the active region, or the gate contact crosses the active region.

The gate contact may be located only in the active region. In this case, the gate contact may be located above the semiconductor fin and cross the semiconductor fin, or may be located only in the active region enclosed by the metal trench without crossing the semiconductor fin. The gate contact may extend across the active region to the outside of the active region. In this case, the contact area between the gate contact and the gate is further increased, and the equivalent resistance of the gate is further reduced.

In a possible implementation, a material of the etching-stop layer includes a compound of two or more elements of a silicon element, a carbon element, a nitrogen element, or an oxygen element.

In a possible implementation, a material of the spacer includes a compound of two or more elements of the silicon element, the carbon element, the nitrogen element, or the oxygen element.

In a possible implementation, the material of the etching-stop layer includes at least one of a silicon oxycarbide $Si_xO_yC_z$, a silicon nitride $Si_xN_y$, a silicon carbide $Si_xC_y$, a silicon carbonitride $Si_xC_yN_z$ or a silicon oxygen carbonitride $Si_xO_yC_zN_w$.

In a possible implementation, the material of the spacer at least one of the silicon oxycarbide $Si_xO_yC_z$, the silicon nitride $Si_xN_y$, the silicon carbide $Si_xC_y$, the silicon carbonitride $Si_xC_yN_z$ or the silicon oxygen carbonitride $Si_xO_yC_zN_w$.

In a possible implementation, a material of the gate contact includes cobalt, tungsten, or copper.

In a possible implementation, a material of the metal gate includes a compound including a tantalum element (Ta) and the nitrogen element N, a compound including a titanium element Ti and the nitrogen element N, a compound including the titanium element Ti or an aluminum element Al, or the tungsten.

In a possible implementation, a material of the metal trench for source or the metal trench for drain includes the cobalt or the tungsten.

In a possible implementation, the isolation layer is a shallow trench isolation (STI) layer.

In a possible implementation, the isolation layer is overlaid on the semiconductor substrate.

In a possible implementation, the structure further includes a source contact and a drain contact. The source contact and the drain contact are in the active region.

In a possible implementation, the height of the metal gate is 40 nanometers (nm) higher than the height of the semiconductor fin.

In a possible implementation, the gate contact crosses the semiconductor fin and wraps the semiconductor fin.

In a possible implementation, there may be a gate dielectric layer between the metal gate and the semiconductor fin.

A second aspect of this application provides a manufacturing method of a field-effect transistor. The method includes forming a metal gate above a semiconductor substrate, forming a metal trench for source and a metal trench for drain on two sides of the metal gate, separately overlaying a first etching-stop layer on the metal trench for source and the metal trench for drain, overlaying a second etching-stop layer on the metal gate, where an etching rate of the second etching-stop layer is higher than an etching rate of the first etching-stop layer, etching away the second etching-stop layer, and forming a gate contact above the metal gate, where the gate contact is at least partially above an active region.

According to the transistor manufacturing method provided in this embodiment of this application, the first etching-stop layer is overlaid on the metal trench for source and the metal trench for drain, and the second etching-stop layer is overlaid on the metal gate. When the second etching-stop layer is etched away from the metal gate to form the gate contact, because the etching rate of the second etching-stop layer is higher than the etching rate of the first etching-stop layer, a first etching layer is still overlaid on a source and a drain when the entire second etching-stop layer is etched away. Therefore, the gate is accurately formed above the metal gate, and current leakage is not caused by short-circuiting the metal trench for source or the metal trench for drain due to a failure to align the gate. Based on this, the gate contact may be formed above the active region. In this way, limitation on the length of the gate contact is reduced, and a shape of the gate contact may be similar to that of the metal gate in a long strip shape. This increases a contact area between the gate contact and the metal gate, and greatly reduces gate resistance.

In a possible implementation, before the forming a metal gate above a semiconductor substrate, the method further includes forming a semiconductor fin above the semiconductor substrate, where the semiconductor fin and the metal gate are arranged in a cross manner, and the semiconductor fin passes through the metal gate.

In a possible implementation, the gate contact extends along a width direction of the metal gate. A width of an end face that is of the gate contact and that is directly adjacent to the metal gate is equal to the length of the metal gate. The length of the gate contact is greater than the length of the metal gate and is less than a width of the metal gate.

In a possible implementation, before the forming a metal trench for source and a metal trench for drain on two sides of the metal gate, the method further includes forming spacers on the two sides of the metal gate, where the spacers are located between the metal trench for source and the metal gate, and between the metal trench for drain and the metal gate.

In a possible implementation, the method further includes forming a metal belt above the gate contact, where the metal belt is connected to the metal gate by using the gate contact, and the metal belt extends along a length direction of the semiconductor fin.

In a possible implementation, before the forming a metal belt above the gate contact, the method further includes polishing a top end face of the spacer and a top end face of the first etching-stop layer, so that the top end face of the spacer and the top end face of the first etching-stop layer are at a same height, the metal belt is located above the spacer and the first etching-stop layer, and the first etching-stop layer is configured to isolate the metal belt from the metal trench for source and the metal trench for drain.

In a possible implementation, that the gate contact intersects the active region includes the gate contact is in the active region, or the gate contact crosses the active region.

In a possible implementation, a material of the first etching-stop layer and a material of the second etching-stop layer each include compounds of two or more elements of a silicon element, a carbon element, a nitrogen element, or an oxygen element. Composition proportions of elements in the material of the first etching-stop layer and the material of the second etching-stop layer are different.

DESCRIPTION OF EMBODIMENTS

In the embodiments of the specification, claims, and accompanying drawings of this application, the terms "first", "second", and so on are intended to distinguish between similar objects but do not necessarily indicate a specific order or sequence. Moreover, the terms "include", "have" and any other variants mean to cover the non-exclusive inclusion, for example, a process, method, system, product, or device that includes a list of steps or units is not necessarily limited to those steps or units, but may include other steps or units not expressly listed or inherent to such a process, method, system, product, or device.

It should be understood that, in this application. "at least one" means one or more, and "a plurality of" means two or more. The term "and/or" is used to describe an association relationship for describing associated objects, and indicates that three relationships may exist. For example, "A and/or B" may represent the following three cases only A exists, only B exists, and both A and B exist, where A and B may be singular or plural. The character "/" generally indicates an "or" relationship between the associated objects. "At least one of the following items (pieces)" or a similar expression indicates any combination of these items, including any combination of singular items (pieces) or plural items (pieces). For example, at least one of a, b, or e may indicate a, b, c. "a and b", "a and c", "b and c" or "a, b, and c", where a, b, and c may be singular or plural.

Figure 1:
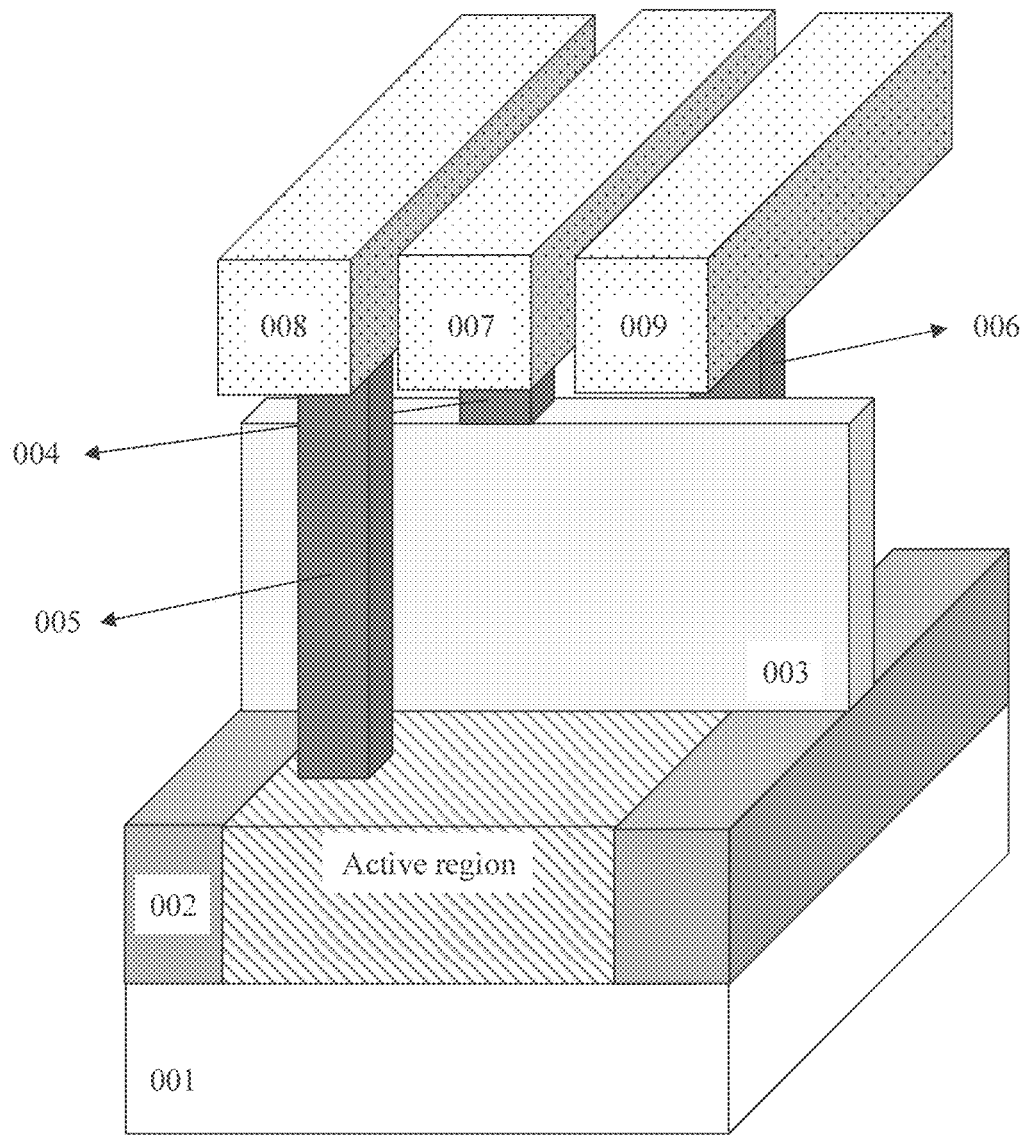
FIG. 1 is an example diagram of a three-dimensional structure of a field-effect transistor according to an embodiment of this application.

The field-effect transistor structure proposed in the embodiments of this application may be applicable to a planar field-effect transistor structure, or may be applicable to a three-dimensional field-effect transistor structure. FIG. 1 is an example diagram of a three-dimensional structure of a field-effect transistor according to an embodiment of this application.

The field-effect transistor includes a semiconductor substrate 001, an isolation layer 002, a metal gate 003, a gate contact 004, a source contact 005, a drain contact 006, a gate metal belt 007, a source metal belt 008, and a drain metal belt 009.

For example, the semiconductor substrate 001 may be a silicon Si substrate, a germanium Ge substrate, a silicon germanium SiGe substrate, a silicon on insulator (SOI) substrate, or a germanium on insulator (GOI) substrate. Alternatively, the semiconductor substrate may be a semiconductor including other elements or a semiconductor including other compounds, for example, gallium arsenide GaAs, indium phosphide InP, or silicon carbide SiC. Alternatively, the semiconductor substrate may be a laminated structure or an epitaxial structure.

For example, the isolation layer 002 may be an STI, and the STI is overlaid on the semiconductor substrate 001.

Although only one metal gate is shown in FIG. 1, there may be a plurality of metal gates on the field-effect transistor. Optionally, the plurality of metal gates extend in parallel on the semiconductor substrate. Optionally, there is further a gate dielectric layer on the outer surface of 003. For example, a material of the metal gate includes a compound including a Ta and a nitrogen element N, a compound including a titanium element Ti and the nitrogen element N, a compound including the titanium element Ti or an aluminum element Al, or tungsten, for example, titanium nitride TiN, TaN, titanium aluminide TiAl, and the tungsten W.

The gate contact 004 is located above the metal gate 003, and the metal gate 003 is at least partially above an active region. Optionally, the gate contact extends along a width direction of the metal gate in a long strip shape. The metal gate may be all located above the active region, or may pass through the entire active region. A middle part of the metal gate is in the active region, and two ends or only one end of the metal gate extends to the outside of the active region.

Although not shown in FIG. 1, the field-effect transistor further includes a metal trench for source and a metal trench for drain. 005 is connected to the metal trench for source, and 006 is connected to the metal trench for drain. The structure further includes an etching-stop layer stopper (not shown in FIG. 1). The etching-stop layer is overlaid on the metal trench for source and the metal trench for drain. There is a spacer between the etching-stop layer and the gate contact 004. In addition, a top end face of the etching-stop layer and a top end face of the spacer are at a same height, and the metal belt 007 is located above the etching-stop layer, the spacer, and the gate contact 004. The etching-stop layer is configured to isolate the metal belt from the metal trench for source and the metal trench for drain.

The source metal belt 008 is led out from the source contact 005, and the drain metal belt 009 is led out from the drain contact 006. The gate contact, the source contact, and the drain contact are staggered from each other, to avoid crossover between the gate metal belt 007, the source metal belt 008 and the drain metal belt 009. The source contact is located above the metal trench for source and is connected to a source. The drain contact is located above the metal trench for drain and is connected to a drain.

It should be understood that, compared with a FinFET structure, the planar field-effect transistor structure in this embodiment of this application does not have a semiconductor fin structure. For another structure in the planar field-effect transistor structure, refer to the following description of the FinFET structure.

Figure 2:
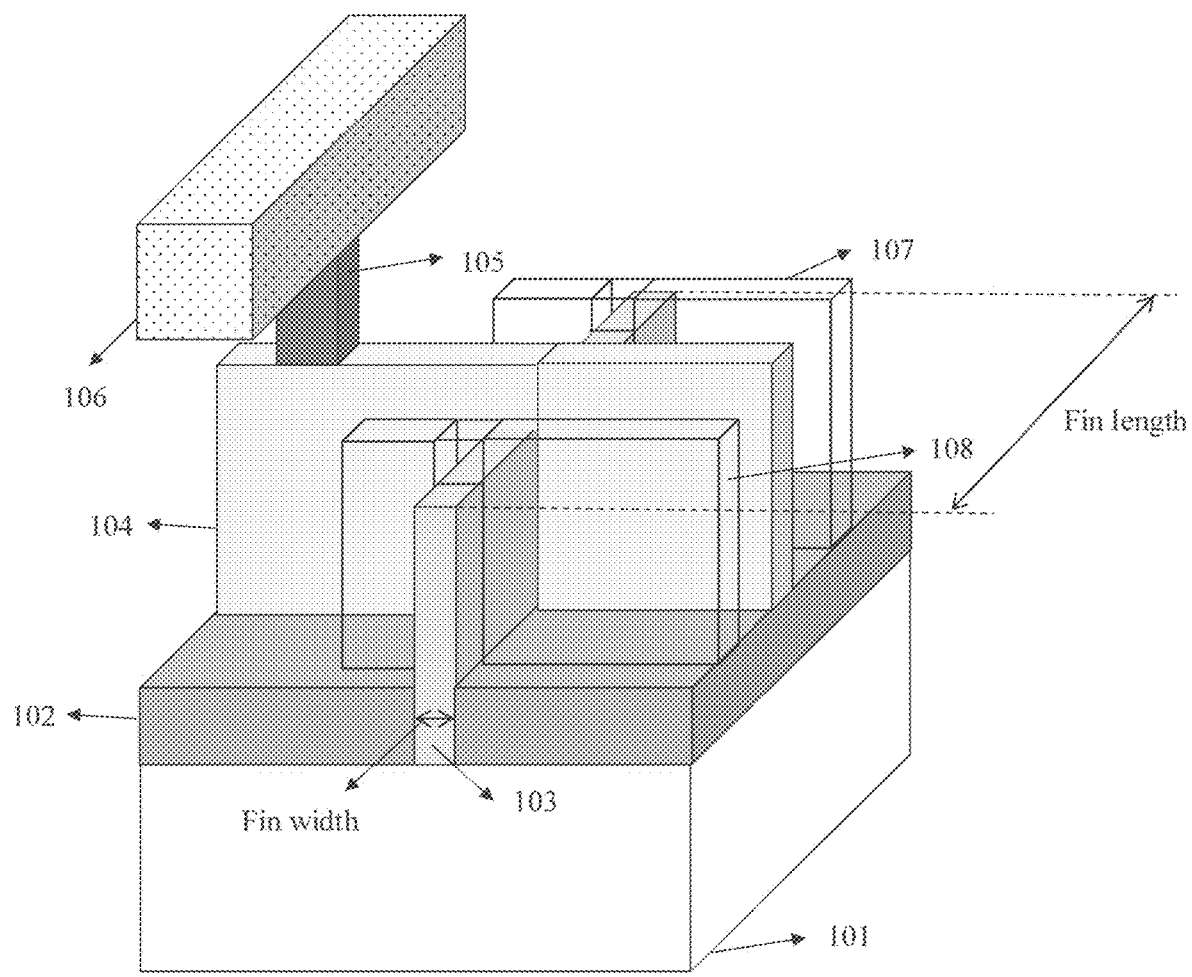
FIG. 2 is an example diagram of a three-dimensional structure of a FinFET according to an embodiment of this application.
Figure 3:
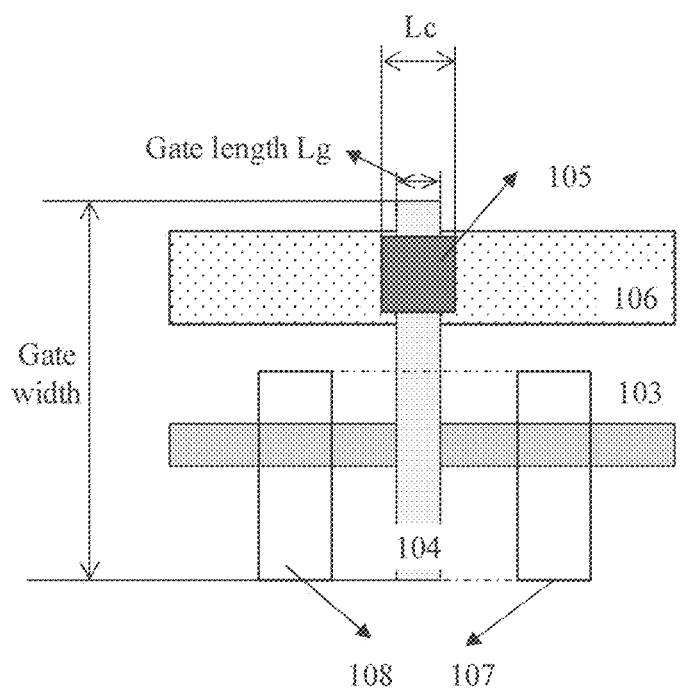
FIG. 3 is an example top view of a FinFET according to an embodiment of this application.

FIG. 2 is an example diagram of a three-dimensional structure of a field-effect transistor according to an embodiment of this application. FIG. 3 is a top view of the FinFET three-dimensional structure shown in FIG. 2.

The FinFET includes a semiconductor substrate 101, an isolation layer 102, a semiconductor fin 103, a metal gate 104, a gate contact 105, a metal belt 106, a metal trench for source 107, and a metal trench for drain 108.

For example, the semiconductor substrate 101 may be a silicon Si substrate, a germanium Ge substrate, a silicon germanium SiGe substrate, a SOI substrate, or a GOI substrate. Alternatively, the semiconductor substrate may be a semiconductor including other elements or a semiconductor including other compounds, for example, gallium arsenide GaAs, indium phosphide InP, or silicon carbide SiC. Alternatively, the semiconductor substrate may be a laminated structure or epitaxial structure.

For example, the isolation layer may be an STI, and the STI is overlaid on the semiconductor substrate 101.

It should be understood that the FinFET 103 may have only one semiconductor fin, as shown in FIG. 2. Optionally, the FinFET may have a plurality of semiconductor fins, where the plurality of semiconductor fins are located above 101, and the plurality of semiconductor fins are separated by the STI. A part of the semiconductor fin is buried in the isolation layer STI, and a part extend above the STI.

The metal gate 104 is located above the semiconductor substrate and the isolation layer. The metal gate intersects with the semiconductor fin, and an area in which the metal gate intersects with the semiconductor fin is a fin, the cross area is a passage, and the metal gate partially wraps the semiconductor fin. In other words, the metal gate and the semiconductor fin cross and extend, or the semiconductor fin passes through the metal gate. In an optional case, the metal gate and the semiconductor fin cross vertically, and the metal gate is higher than the semiconductor fin. In an optional case, the metal gate is 40 nanometers higher than the semiconductor fin. It should be understood that although only one metal gate is shown in FIG. 2, there may be a plurality of metal gates on the FinFET. Optionally, the plurality of metal gates extend in parallel on the semiconductor substrate. Optionally, there is further one gate dielectric layer between 104 and 103. For example, a material of the metal gate includes a compound including a Ta and a nitrogen element N, a compound including a titanium element Ti and the nitrogen element N, a compound including the titanium element Ti or an aluminum element Al, or tungsten, for example, TiN, taN, TiAl, and the tungsten W.

The gate contact 105 is located above the metal gate 104, and is outside an active region. For example, the gate contact 105 may be cobalt, tungsten, or copper. It should be understood that the width of a bottom end face that is of the gate contact and that is directly adjacent to the metal gate may be the same as the gate length of the metal gate 105 at a maximum width. However, the length of a top end face that is of the gate contact and that is away from the metal gate is greater than the gate length of the metal gate. In other words, the gate contact is in an inverted trapezoid shape. Therefore, in FIG. 3, the width Le of the gate contact 105 is greater than the gate length Lg of the metal gate 104.

The metal belt 106 is located above the gate contact 105 and is connected to the gate 104 by using 105. The metal belt 106 extends along a length direction of the semiconductor fin 103, and a cable connected to 106 is considered to be connected to 104.

The metal trench for source 107 and the metal trench for drain 108 are located on two sides of the metal gate 104. In an optional case, 107 is the metal trench for drain, and 108 is the metal trench for source. This is not limited in this embodiment of this application. To avoid current leakage caused by short-circuiting the metal gate and the metal trench for source or the metal gate and the metal trench for drain. There is a spacer (not shown in the figure) between 104 and 107 and between 104 and 108. A material of the spacer may be a compound of two or more elements of a silicon element, a carbon element, the nitrogen element or an oxygen element, for example, may be at least one of a silicon oxycarbide $Si_xO_yC_z$, a silicon nitride $Si_xN_y$, a silicon carbide $Si_xC_y$, a silicon carbonitride $Si_xC_yN_z$ or a silicon oxygen carbonitride $Si_xO_yC_zN_w$, x, y, z, and w are positive integers not less than 1. Values of x, y, z, and w are not limited in this embodiment of this application. A material of the metal trench for source or the metal trench for drain includes the cobalt or the tungsten.

It should be noted that the semiconductor substrate 101 and the isolation layer 102 are not shown in FIG. 3, and 105 is the metal gate. Because the metal gate 10S is located below the metal belt 106, only the metal belt 106 can be actually seen in the top view, and the metal gate 105 cannot be seen. To clearly describe the FinFET structure, FIG. 3 shows the metal gate 105 in this embodiment of this application.

As shown in FIG. 3, an area enclosed by 107, 108 and two dashed lines is the active region. Both the semiconductor fin 103 and the metal gate 104 cross the active region, and a cross area of 103 and 104 is located in the active region. It should be understood that, in FIG. 3, one end of the metal gate 104 is flush with one end of the metal trench for source 107 and one end of the metal trench for drain 108. This is merely an example. In an actual case, both ends of the metal gate may be outside the active region.

Figure 4:
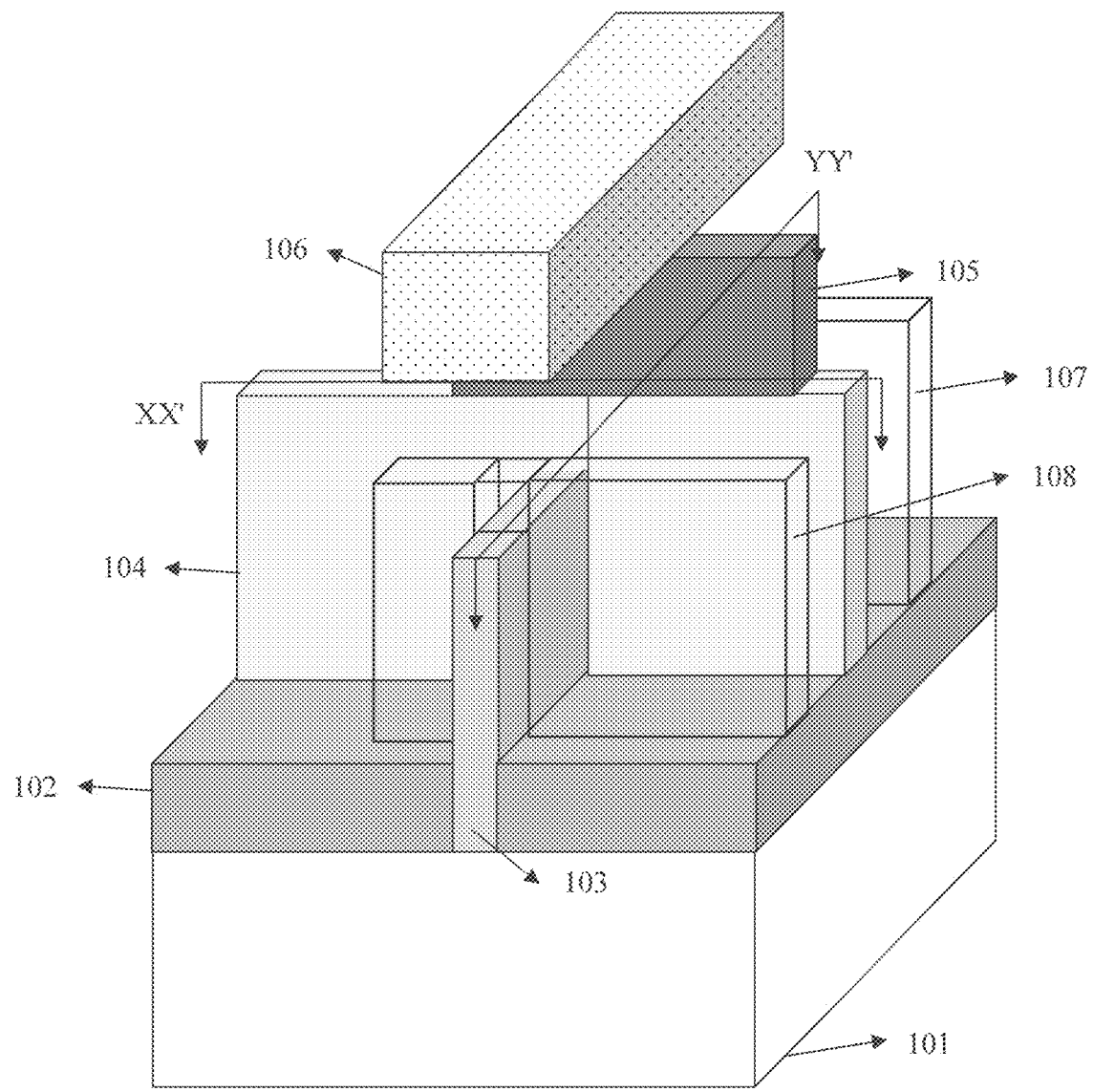
FIG. 4 is an example diagram of another three-dimensional structure of a FinFET according to an embodiment of this application.
Figure 5:
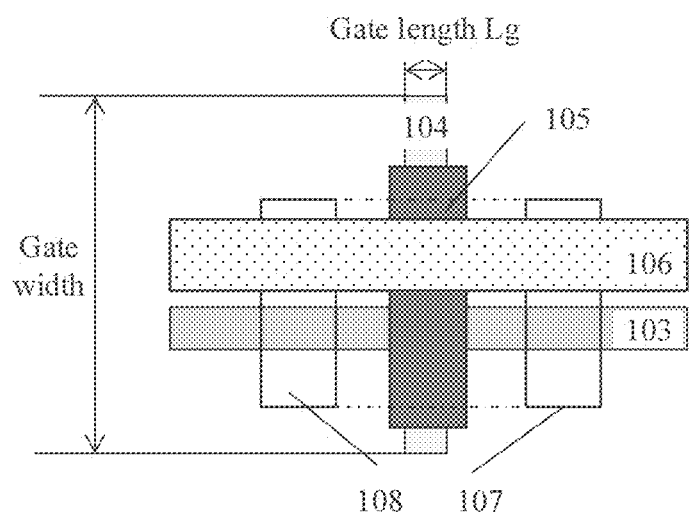
FIG. 5 is an example top view of a FinFET according to an embodiment of this application.
Figure 6:
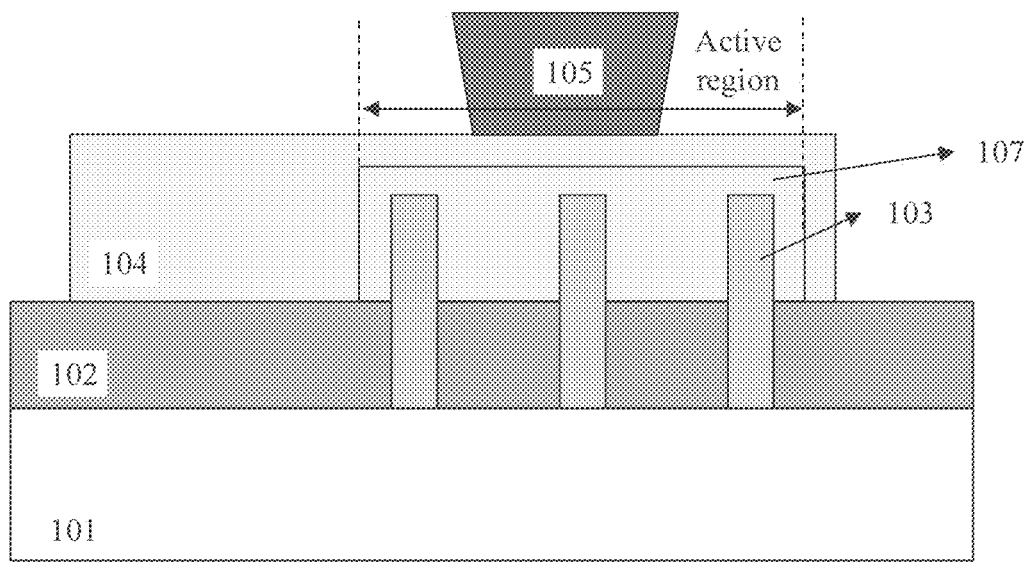
FIG. 6 is an example sectional view of a FinFET three-dimensional structure along an XX' direction according to an embodiment of this application.
Figure 7:
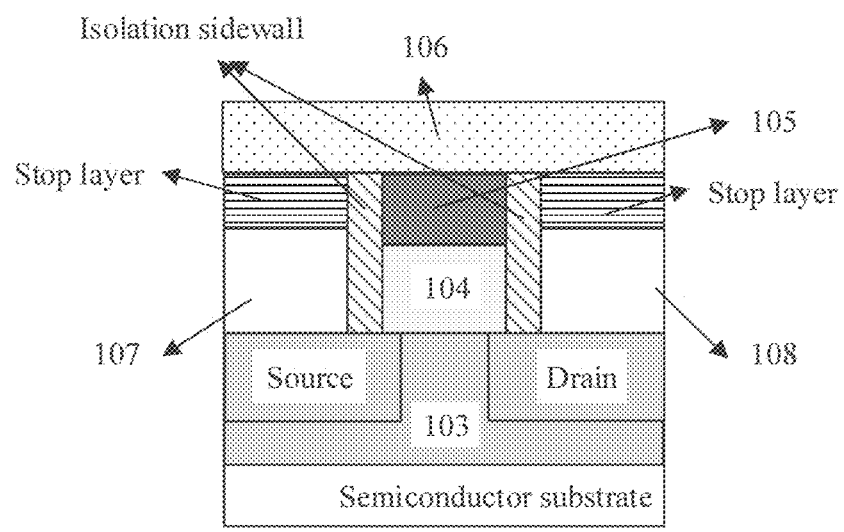
FIG. 7 is an example sectional view of a FinFET three-dimensional structure along a YY' direction according to an embodiment of this application.

FIG. 4 is an example diagram of another three-dimensional structure of a field-effect transistor according to an embodiment of this application. FIG. 5 is a top view of the three-dimensional structure shown in FIG. 4. FIG. 6 is an example sectional view of the FinFET three-dimensional structure along an XX' direction, and FIG. 7 is an example sectional view of the FinFET three-dimensional structure along a YY' direction. FIG. 7 shows a spacer between a metal gate 104 and a metal trench for source 107 and between the metal gate 104 and a metal trench for drain.

For ease of understanding, a same reference numeral is used in FIG. 4 and FIG. 2. In an embodiment, 101 is a semiconductor substrate. 102 is an isolation layer, 103 is a semiconductor fin, 104 is the metal gate, 105 is a gate contact. 106 is a metal belt, 107 and 108 are the metal trench for source and the metal trench for drain. There is a spacer between 104, and 107 and between 104 and 108. It should be noted that three semiconductor fins are shown in the FinFET structure in FIG. 6. However, in the three-dimensional diagram of the FinFET shown in FIG. 4, only one semiconductor fin is shown. In addition, in FIG. 6, the metal belt 106 is omitted, and only the gate contact 105 is shown. In addition, to clearly show the FinFET structure, the metal trench for source 107, which cannot be actually seen in the sectional view along the XX' direction, is further shown in FIG. 6.

In the FinFET structure shown in FIG. 4, the gate contact 105 is located above the metal gate 104, extends along a width direction of the metal gate, and intersects with an active region. In other words, the metal gate is at least partially above the active region. It should be understood that the active region is a region enclosed by the metal trench for source and the metal trench for drain. As shown in FIG. 3 and FIG. 5, the active region is the region enclosed by two dashed lines 107 and 108. FIG. 6 also shows a scope of the active region, both the semiconductor fin 103 and the metal gate 104 cross the active region, and a cross area of 103 and 104 is located in the active region. Herein, that the gate contact intersects the active region may include the gate contact extends from outside the active region shown in FIG. 3 to above the active region. In this case, a part of the gate contact is outside the active region, another part of the gate contact is in the active region, and the part of the gate contact that is in the active region does not cross the semiconductor fin. Alternatively, the gate contact 105 is in the active region, as shown in FIG. 6. Alternatively, the gate contact crosses the entire active region, as shown in FIG. 5. In this case, the gate contact crosses at least one semiconductor fin, a middle part of the gate contact is in the active region, and two ends of the gate contact are outside the active region.

In an optional case, the width of an end face that is directly adjacent to the metal gate and that is of the gate contact is less than or equal to the gate length of the metal gate. The length of the gate contact is greater than the length of the metal gate and is less than the width of the metal gate. As shown in FIG. 5, the metal gate extends along the width direction of the metal gate, and crosses the semiconductor fin 103. Therefore, a shape of the gate contact may be similar to that of the metal gate in a long strip shape. It should be understood that the length of a bottom end face that is of the gate contact and that is directly adjacent to the metal gate is the same as the length of the metal gate 105. However, a top end face that is away from the metal gate is greater than the length of the metal gate, and the gate contact is in an inverted trapezoid shape, as shown in FIG. 6.

The FinFET structure shown in FIG. 4 further includes an etching-stop layer stopper (not shown in FIG. 4). As shown in FIG. 7, the etching-stop layer is overlaid on the metal trench for source 107 and the metal trench for drain 108. There is a spacer between the etching-stop layer and the gate contact 105. A top end face of the etching-stop layer and a top end face of the spacer are at a same height, and the metal belt 106 is located above the etching-stop layer, the spacer, and the gate contact 105. The etching-stop layer is configured to isolate the metal belt from the metal trench for source and the metal trench for drain. For example, a material of the etching-stop layer may include a compound of two or more elements of a silicon element, a carbon element, a nitrogen element, or an oxygen element, for example, may be at least one of a silicon oxycarbide $Si_xO_yC_z$, a silicon nitride $Si_xN_y$, a silicon carbide $Si_xC_y$, a silicon carbonitride $Si_xC_yN_z$ or a silicon oxygen carbonitride $Si_xO_yC_zN_w$, x, y, z, and w are positive integers not less than 1. Values of x, y, z, and w are not limited in this embodiment of this application. It should be understood that although elements in the material of the spacer and the material of the etching-stop layer may be the same, composition proportions of the elements in the material of the spacer and the material of the etching-stop layer are different. An etching rate of the material varies with the composition proportion of each element.

The FinFET structure shown in FIG. 4 further includes a source and a drain. As shown in FIG. 7, the source and the drain are separately located in semiconductor fins on two sides of the metal gate 104. The metal trench for source 107 is located above the source and is connected to the source, and the metal trench for drain 108 is located above the drain and is connected to the drain. It should be understood that there is also a spacer (not shown in the figure) between the source, the drain, and the metal gate.

For descriptions of the semiconductor substrate 101, the isolation layer 102, the semiconductor fin 103, the metal gate 104, the metal belt 106, the metal trench for source 107, and the metal trench for drain 108, refer to descriptions in the embodiment in FIG. 2. Details are not described herein again.

According to the FinFET structure provided in this embodiment of this application, because the gate contact may extend above the active region on the metal gate, limitation on the length of the gate contact is reduced, and the shape of the gate contact may be similar to that of the metal gate in the long strip shape. This increases a contact area between the gate contact and the metal gate, and greatly reduces gate resistance. Further, because the metal belt is placed above the gate contact, the gate resistance is equivalent to parallel resistance of the metal gate resistance, gate contact resistance and the metal belt resistance. The metal belt is laid above to further reduce the equivalent resistance of the gate. The metal belt extends along a length direction of the fin, and that an external device is connected to the metal belt is equivalent to that the external device is connected to the metal gate. This facilitates cabling.

Figure 8:
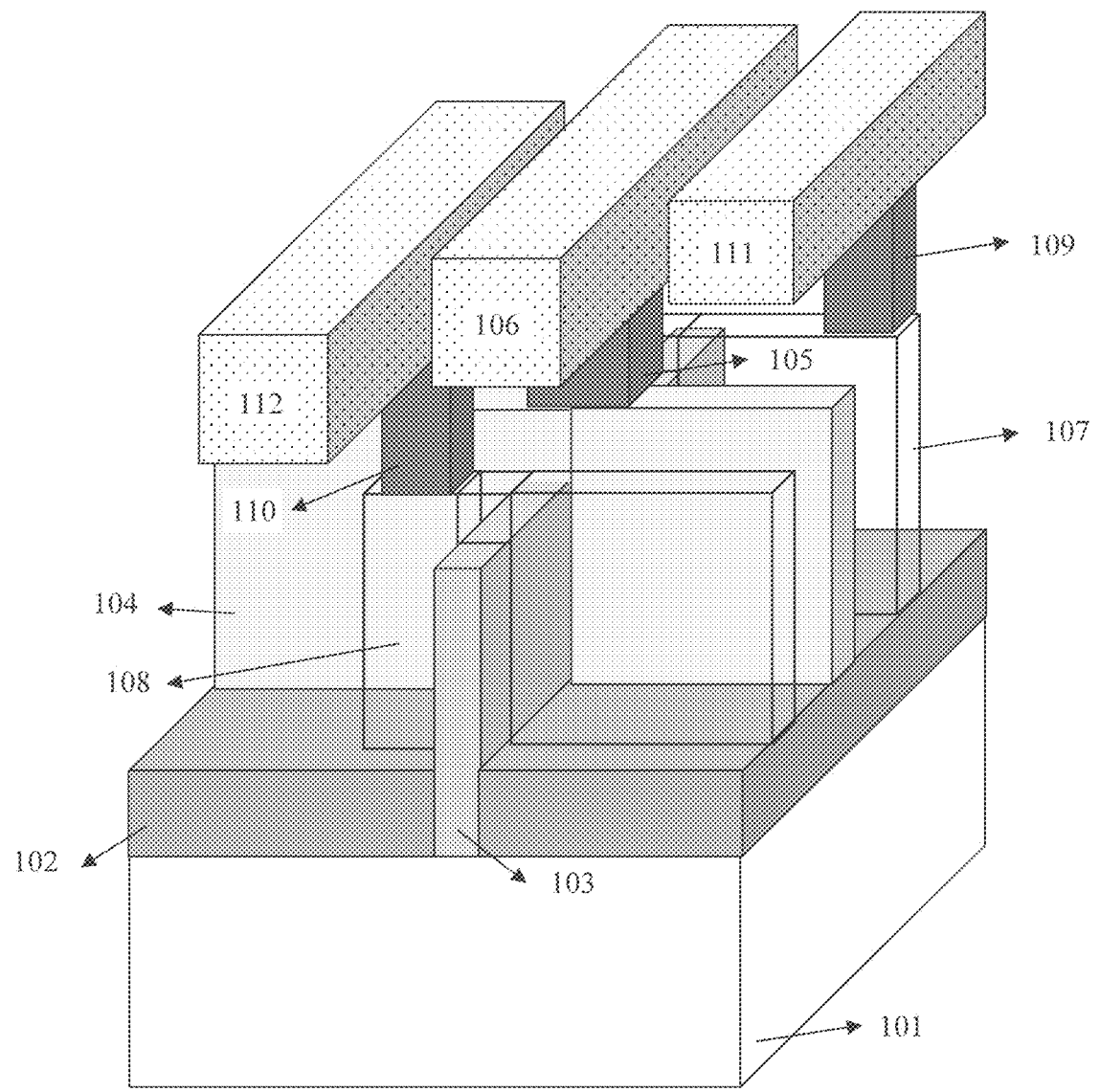
FIG. 8 is an example diagram of another three-dimensional structure of a FinFET according to an embodiment of this application.

FIG. 8 is an example diagram of another three-dimensional structure of a field-effect transistor according to an embodiment of this application. It should be noted that a same reference numeral is used for a part that is the same as that in FIG. 2 and FIG. 4.

The FinFET shown in FIG. 8 includes a semiconductor substrate 101, an isolation layer 102, a semiconductor fin 103, a metal gate 104, a gate contact 105, a gate metal belt 106, a metal trench for source 107, a metal trench for drain 108, a source contact 109, a drain contact 110, a source metal belt 111, and a drain metal belt 112.

Structures of components 101 to 108 are the same as those of the components shown in FIG. 4. For details, refer to descriptions of the embodiment corresponding to FIG. 4. Details are not described herein again. The gate contact 105 shown in FIG. 8 is located in the active region. It should be understood that the gate contact may alternatively cross the entire active region. This is not limited in this embodiment of this application. The FinFET structure shown in FIG. 8 further includes the source contact 109 and the drain contact 110, the source metal belt 111 led out from the source contact, and the drain metal belt 112 led out from the drain contact. The gate contact, the source contact, and the drain contact are staggered from each other, to avoid crossover between the gate metal belt, the source metal belt, and the drain metal belt. The source contact is located above the metal trench for source and is connected to a source. The drain contact is located above the metal trench for drain and is connected to a drain.

Figure 9:
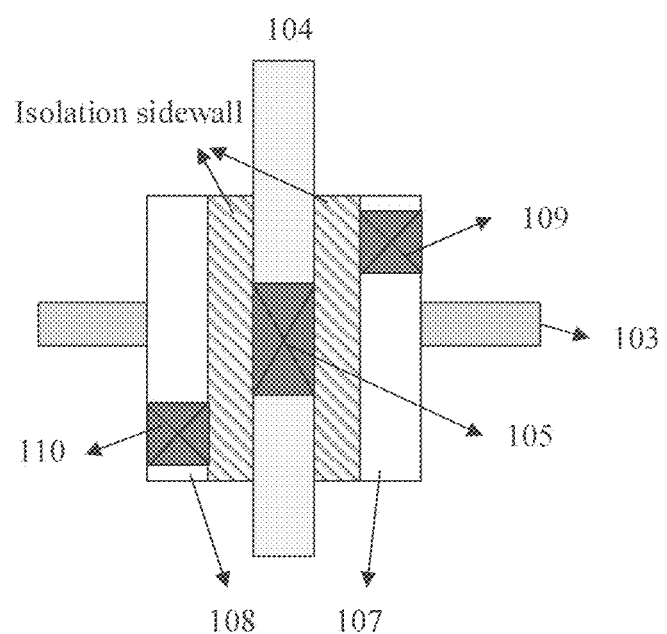
FIG. 9 is an example top view of a FinFET according to an embodiment of this application.

FIG. 9 is a top view of the Fin-FET structure shown in FIG. 8. It should be understood that the gate metal belt, the source metal belt, and the drain metal belt are omitted in FIG. 9. There is a spacer between the metal gate 104 and the metal trench for source 107, and between the metal gate 104 and the metal trench for drain.

Figure 10:
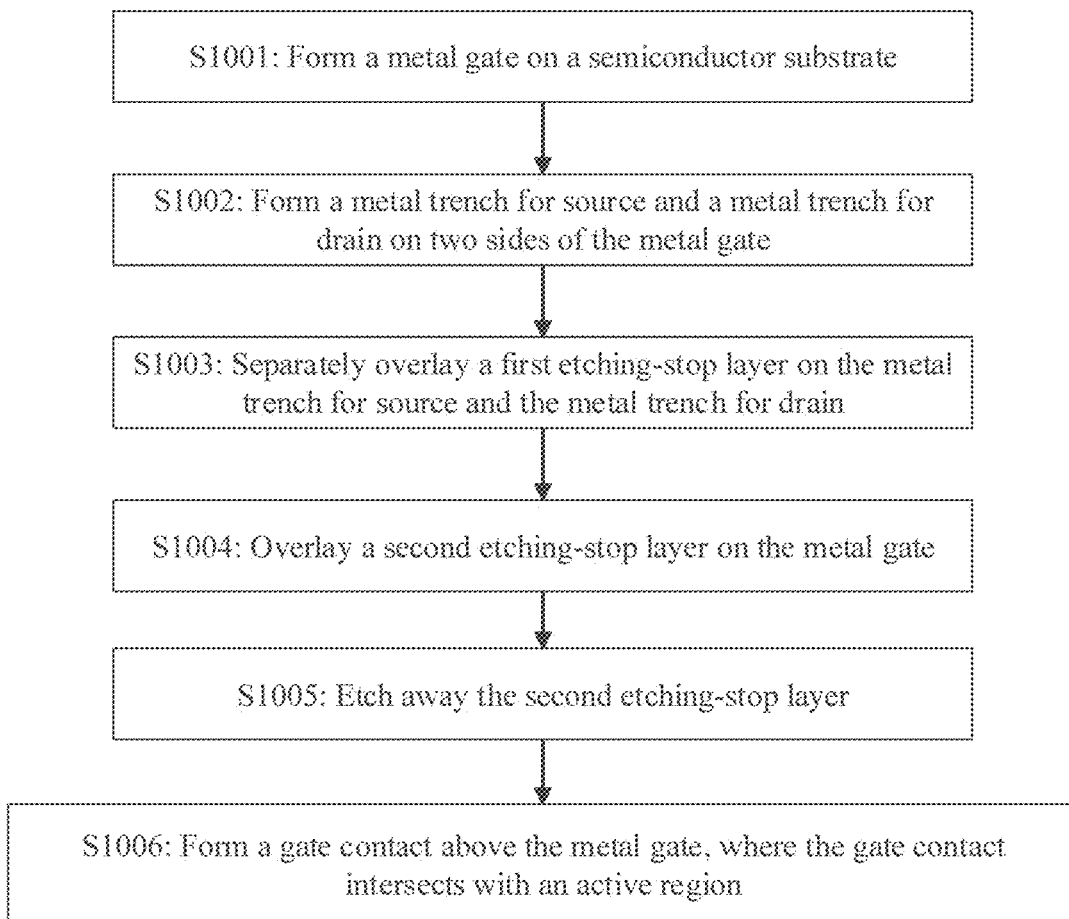
FIG. 10 is an example flowchart of a manufacturing method of a field-effect transistor according to an embodiment of this application.

FIG. 10 shows a manufacturing method of a field-effect transistor according to an embodiment of this application. The method includes the following steps.

S1001. Form a metal gate on a semiconductor substrate.

A material of the metal gate includes a compound including a Ta and a nitrogen element N, a compound including a titanium element Ti and the nitrogen element N, a compound including the titanium element Ti or an aluminum element Al, or tungsten, for example, TiN, taN, TiAl, and the tungsten W.

S1002. Form a metal trench for source and a metal trench for drain on two sides of the metal gate.

Optionally, before step S1002, the method further includes forming spacers on two sides of the metal gate, where a material of the spacers includes compounds of two or more elements of a silicon element, a carbon element, the nitrogen element, or an oxygen element, for example, may be at least one of a silicon oxycarbide $Si_xO_yC_z$, a silicon nitride SixNy, a silicon carbide $Si_xC_y$, a silicon carbonitride $Si_xC_yN_z$ or a silicon oxygen carbonitride $Si_xO_yC_zN_w$, x, y, z, and w are positive integers not less than 1. Values of x, y, z, and w are not limited in this embodiment of this application. A material of the metal trench for source or the metal trench for drain includes cobalt or the tungsten. The spacer is located between the metal trench for source and the metal gate, and between the metal trench for drain and the metal gate.

S1003. Separately overlay a first etching-stop layer on the metal trench for source and the metal trench for drain.

S1004. Overlay a second etching-stop layer on the metal gate.

It should be understood that a material of the first etching-stop layer and a material of the second etching-stop layer include compounds of two or more elements of the silicon element, the carbon element, the nitrogen element, or the oxygen element. Composition proportions of elements in the material of the first etching-stop layer and the material of the second etching-stop layer are different, to meet a condition that an etching rate of the second etching-stop layer is higher than an etching rate of the first etching-stop layer.

S1005. Etch away the second etching-stop layer.

S1006. Form a gate contact above the metal gate, where the gate contact extends along a width direction of the metal gate and intersects with an active region.

It should be understood that the active region is a region enclosed by the metal trench for source and the metal trench for drain.

Figure 13:
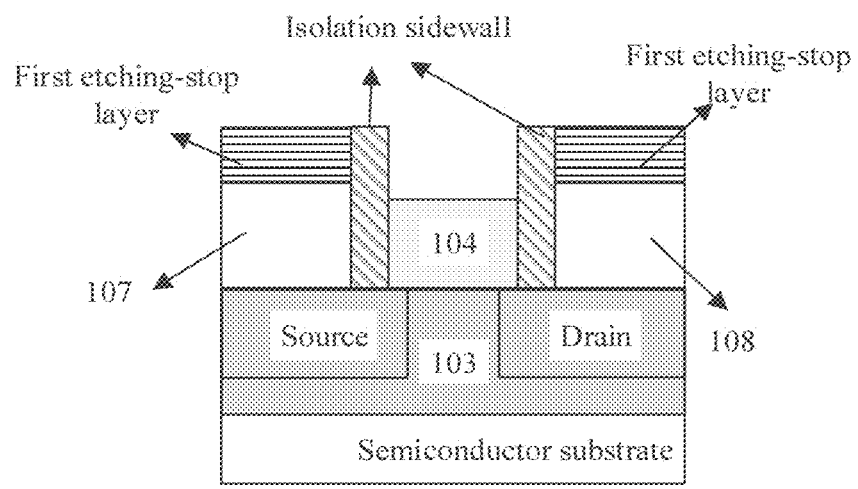
FIG. 13 is a schematic diagram of another example state in a FinFET manufacturing process according to an embodiment of this application.
Figure 14:
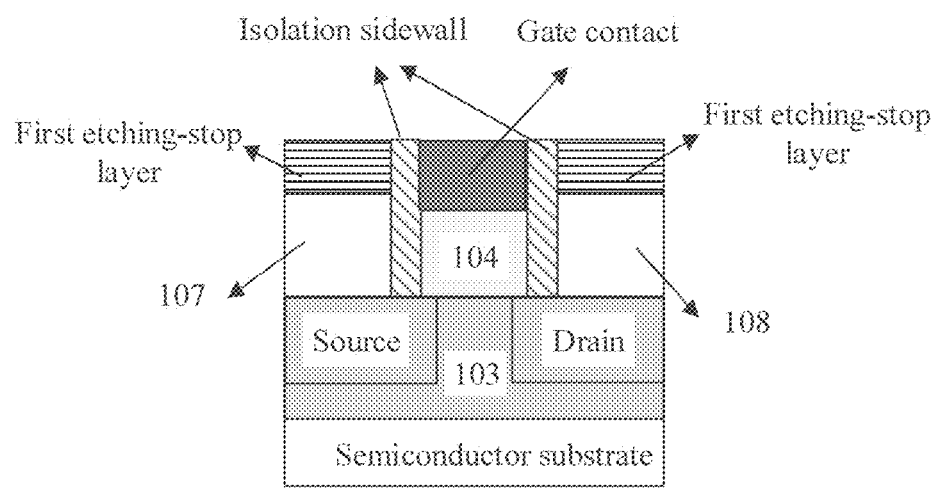
FIG. 14 is a schematic diagram of another example state in a FinFET manufacturing process according to an embodiment of this application.

Because the etching rate of the second etching-stop layer is higher than the etching rate of the first etching-stop layer, when the second etching-stop layer is etched away, a part of the first etching-stop layer is also etched away. However, the etched first etching-stop layer is far less than the second etching-stop layer. When the second etching-stop layer is completely removed, only a small part of the first etching-stop layer on the metal trench for source and the metal trench for drain is damaged, as shown in FIG. 13. The second etching-stop layer on the metal gate has been completely removed, and a sufficient part of first etching-stop layer is retained above the metal trench for source and the metal trench for drain. Therefore, when the second etching-stop layer on the metal gate is etched away, there is no need to worry about incorrectly punching an etching hole above the metal trench for source or the metal trench for drain due to an etching alignment problem. This improves accuracy of etching alignment. After the second etching-stop layer is removed, the gate contact is accurately formed above the metal gate, as shown in FIG. 14.

In addition, because there is further the spacer between the metal trench for source and the metal gate, and between the metal trench for drain and the metal gate, an etching rate of the spacer is also less than the etching rate of the second etching-stop layer. The etching rate of the spacer and the etching rate of the first etching-stop layer is not limited in this embodiment of this application. When the second-stop layer is etched away, the spacer can further prevent the gate contact from being formed above the metal trench for source or the metal trench for drain.

Figure 11:
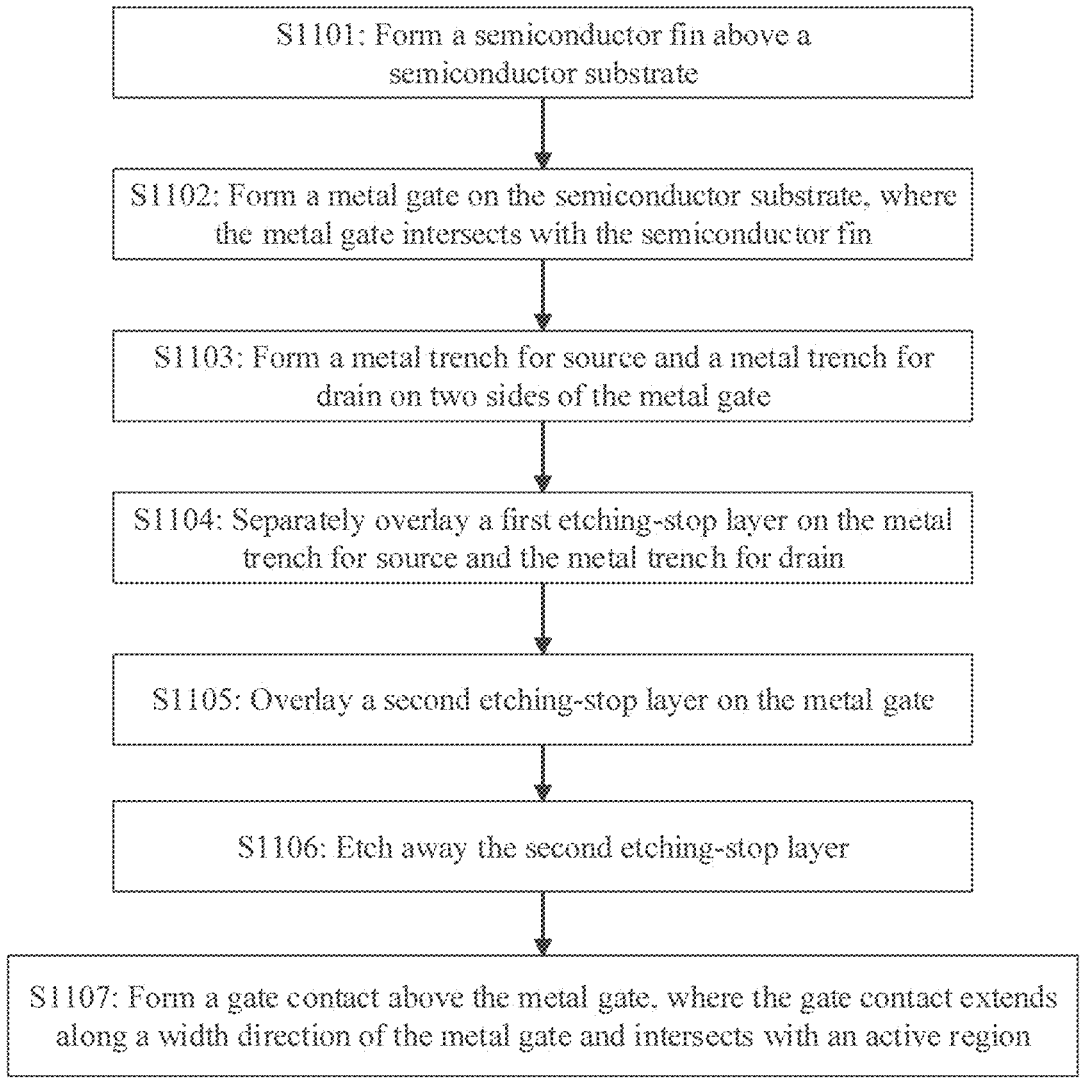
FIG. 11 is an example flowchart of a manufacturing method of a FinFET according to an embodiment of this application.
Figure 12:
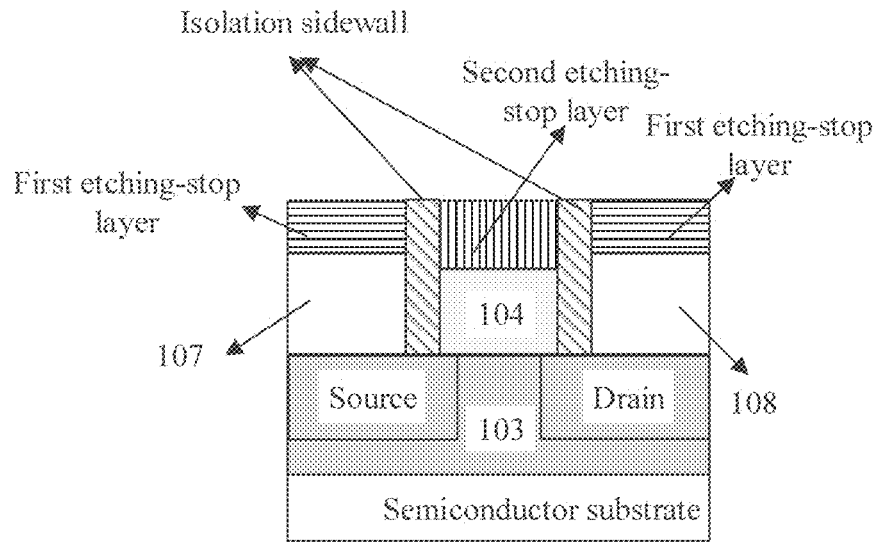
FIG. 12 is a schematic diagram of an example state in a FinFET manufacturing process according to an embodiment of this application.

FIG. 11 shows a manufacturing method of a Fin-FET according to an embodiment of this application. It should be understood that, in this embodiment of this application, the manufacturing method of the transistor is described in a form of steps. Although a sequence of the method is shown in the method flowchart FIG. 10 and FIG. 11, in some cases, the described steps may be performed in a sequence different from that herein. FIG. 12 to FIG. 14 are schematic diagrams of three states in a process of etching away a second etching-stop layer on a metal gate, to accurately form a gate contact above the metal gate.

The method includes the following steps.

S1101. Form a semiconductor fin above a semiconductor substrate.

In an optional case, only one semiconductor fin may be formed above the semiconductor substrate. A quantity of semiconductor fins is not limited in this embodiment of this application. An isolation layer is formed between a plurality of semiconductor fins, and the isolation layer may be an STI. For a material of the semiconductor substrate, refer to descriptions in the embodiment in FIG. 2.

S1102. Form the metal gate on the semiconductor substrate, where the metal gate intersects with the semiconductor fin.

The metal gate is located above the semiconductor substrate and the semiconductor fin. For example, a top end face of the metal gate is 40 nanometers higher than a top end face of the semiconductor fin. A material of the metal gate includes a compound including a Ta and a nitrogen element N, a compound including a titanium element Ti and the nitrogen element N, a compound including the titanium element Ti or an aluminum element Al, or tungsten, for example, TIN, TaN, TiAl, or the tungsten W.

S1103. Form a metal trench for source and a metal trench for drain on two sides of the metal gate.

Optionally, before step S1002, the method further includes forming spacers on two sides of the metal gate, where a material of the spacers includes compounds of two or more elements of a silicon element, a carbon element, the nitrogen element, or an oxygen element, for example, may be at least one of a silicon oxycarbide $Si_xO_yC_z$, a silicon nitride SixNy, a silicon carbide $Si_xC_y$, a silicon carbonitride $Si_xC_yN_z$ or a silicon oxygen carbonitride $Si_xO_yC_zN_w$, x, y, z, and w are positive integers not less than 1. Values of x, y, z, and w are not limited in this embodiment of this application. A material of the metal trench for source or the metal trench for drain includes cobalt or the tungsten. The spacer is located between the metal trench for source and the metal gate, and between the metal trench for drain and the metal gate.

S1104. Separately overlay a first etching-stop layer on the metal trench for source and the metal trench for drain.

S1105. Overlay a second etching-stop layer on the metal gate.

As shown in FIG. 12, the first etching-stop layer is overlaid on the metal trench for source and the metal trench for drain, and the second etching-stop layer is overlaid on the metal gate. In an optional case, top end faces of the first etching-stop layer, the second etching-stop layer, and the spacer are at a same height.

It should be understood that a material of the first etching-stop layer and a material of the second etching-stop layer include compounds of two or more elements of the silicon element, the carbon element, the nitrogen element, or the oxygen element. Composition proportions of elements in the material of the first etching-stop layer and the material of the second etching-stop layer are different, to meet a condition that an etching rate of the second etching-stop layer is higher than an etching rate of the first etching-stop layer.

S1106. Etch away the second etching-stop layer.

S1107. Form a gate contact above the metal gate, where the gate contact extends along a width direction of the metal gate and intersects with an active region.

The active region is a region enclosed by the metal trench for source and the metal trench for drain. Both the semiconductor fin 103 and the metal gate 104 cross the active region, and a cross area of 103 and 104 is located in the active region.

Because the etching rate of the second etching-stop layer is higher than the etching rate of the first etching-stop layer, when the second etching-stop layer is etched away, a part of the first etching-stop layer is also etched away. However, the etched first etching-stop layer is far less than the second etching-stop layer. When the second etching-stop layer is completely removed, only a small part of the first etching-stop layer on the metal trench for source and the metal trench for drain is damaged, as shown in FIG. 13. The second etching-stop layer on the metal gate has been completely removed, and a sufficient part of first etching-stop layer is retained above the metal trench for source and the metal trench for drain. Therefore, when the second etching-stop layer on the metal gate is etched away, there is no need to worry about incorrectly punching an etching hole above the metal trench for source or the metal trench for drain due to an etching alignment problem. This improves accuracy of etching alignment. After the second etching-stop layer is removed, the gate contact is accurately formed above the metal gate, as shown in FIG. 14.

In addition, because there is further the spacer between the metal trench for source and the metal gate, and between the metal trench for drain and the metal gate, an etching rate of the spacer is also less than the etching rate of the second etching-stop layer. The etching rate of the spacer and the etching rate of the first etching-stop layer is not limited in this embodiment of this application. When the second-stop layer is etched away, the spacer can further prevent the gate contact from being formed above the metal trench for source or the metal trench for drain.

Optionally, the method may further include polishing a top end face of the spacer and the top end face of the first etching-stop layer, so that the top end face of the spacer and the top end face of the first etching-stop layer are at a same height. In addition, polishing a top end face of the gate contact, so that the top end faces of the gate contact, the isolation side wall, and the first etching-stop layer are at a same height.

Optionally, the method may further include a metal belt is formed above the gate contact. The metal belt is connected to the metal gate by using the gate contact, and the metal belt extends along a length direction of the fin.

In an optional case, the width of an end face that is of the gate contact and that is directly adjacent to the metal gate is less than or equal to the length of the metal gate. The length of the gate contact is greater than the length of the metal gate and is less than the width of the metal gate. The metal gate crosses the semiconductor fin along the width direction of the metal gate.

In an optional case, that the gate contact intersects the active region may include the gate contact is in the active region, as shown in FIG. 6. Alternatively, the gate contact crosses the entire active region, as shown in FIG. 5. In this case, the gate contact crosses at least one semiconductor fin, a middle part of the gate contact is in the active region, and two ends of the gate contact are outside the active region. Alternatively, the gate contact extends from outside the active region shown in FIG. 3 to above the active region. In this case, a part of the gate contact is outside the active region, another part of the gate contact is in the active region, and the part of the gate contact that is in the active region does not cross the semiconductor fin.

It should be understood that, because the first etching-stop layer and the second etching-stop layer have different etching rates, the accuracy of the etching alignment is ensured. The gate contact may be accurately formed on the active region of the gate, and there is no need to worry about current leakage caused by short-circuiting the metal trench for source or the metal trench for drain due to a failure to align the gate. Based on this, the gate contact may be formed above the active region. In this way, limitation on the length of the gate contact is reduced, and a shape of the gate contact may be similar to that of the metal gate in a long strip shape. This increases a contact area between the gate and the metal gate, and greatly reduces gate resistance.

The foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of the embodiments of this application. For example, for some specific operations in the apparatus embodiment, refer to the foregoing method embodiments.

What is claimed is:

1. A field-effect transistor structure comprising:
a semiconductor substrate;
a source located in an active region above the semiconductor substrate;
a drain located in the active region above the semiconductor substrate;
a metal gate having a first bottom end located above the active region, wherein the metal gate has a first side and a second side;
a first metal trench associated with the source, wherein the first metal trench is located on the first side of the metal gate and has a second bottom end above a first top end face of the source in the active region;
a second metal trench associated with the drain, wherein the second metal trench is located on the second side of the metal gate and has a third bottom end above a second top end face of the drain in the active region, wherein the second bottom end of the first metal trench and the third bottom end of the second metal trench are at a same height of the first bottom end of the metal gate, and wherein the first top end face of the source and the second top end face of the drain are at a same height of the first bottom end of the metal gate;
an etching-stop layer overlaid on the first metal trench and the second metal trench;
a gate contact located above the metal gate and is at least partially above the active region;
a spacer located between the first metal trench and the metal gate and between the second metal trench and the metal gate, wherein a third top end face of the spacer and a fourth top end face of the etching-stop layer are at a same height;

a metal belt located above the gate contact and connected to the metal gate using the gate contact wherein the metal belt is located above the spacer and the etching-stop layer, wherein the etching-stop layer is configured to isolate the metal belt from the first metal trench and isolate the metal belt from the second metal trench; and a semiconductor fin located above the semiconductor substrate, wherein the semiconductor fin and the metal gate are arranged in a cross manner, and wherein the semiconductor fin passes through the metal gate, wherein the gate contact extends from outside the active region to above the active region, and wherein a first part of the gate contact is outside the active region and a second part of the gate contact is in the active region, and wherein the second part that is in the active region does not cross the semiconductor fin.

2. The field-effect transistor structure of claim 1, wherein the active region is a region enclosed by the first metal trench and the second metal trench, wherein a part in which the metal gate and the semiconductor fin intersect is located in the active region.

3. The field-effect transistor structure of claim 1, wherein the metal belt extends along a length direction of the semiconductor fin.

4. The field-effect transistor structure of claim 1, wherein the gate contact is in the active region or the gate contact crosses the active region, wherein the etching-stop layer is configured to:
isolate the metal belt from the first metal trench; and
isolate the metal belt from the second metal trench.

5. The field-effect transistor structure of claim 1, further comprising:
a plurality of semiconductor fins;
the source located in one of the semiconductor fins on the first side; and
the drain located in another of the semiconductor fins on the second side.

6. The field-effect transistor structure of claim 5, wherein the first metal trench is located above the source and is connected to the source, and wherein the second metal trench is located above the drain and is connected to the drain.

7. The field-effect transistor structure of claim 1, wherein the gate contact extends along a width direction of the metal gate, wherein a first width of an end face that is of the gate contact and that is directly adjacent to the metal gate is equal to a first length of the metal gate, and wherein a second length of the gate contact is greater than the first length and is less than a second width of the metal gate.

8. The field-effect transistor structure of claim 1, wherein a material of the etching-stop layer comprises a compound of two or more of a silicon element, a carbon element, a nitrogen element, or an oxygen element.

9. The field-effect transistor structure of claim 1, wherein both the semiconductor fin and the metal gate cross the active region, and wherein a cross area of the semiconductor fin and the metal gate is located in the active region.

10. The field-effect transistor structure of claim 1, wherein the gate contact crosses the active region and the semiconductor fin.

11. The field-effect transistor structure of claim 1, wherein a first shape of the gate contact is a strip shape and is similar to a second shape of the metal gate.

12. The field-effect transistor structure of claim 1, wherein a top end face of the gate contact that is away from the metal gate is greater than a length of the metal gate, and wherein the gate contact has an inverted trapezoid shape.

13. The field-effect transistor structure of claim 1, wherein further comprising:
a source contact connected to the source, wherein the source contact is located on the first metal trench; and
a drain contact connected to the drain, wherein the drain contact is located on the second metal trench.

14. The field-effect transistor structure of claim 13, further comprising:
a source metal belt led out from the source contact; and
a drain metal belt led out from the drain contact,
wherein the gate contact, the source contact, and the drain contact are staggered from each other.

15. The field-effect transistor structure of claim 13, further comprising a plurality of semiconductor fins, wherein the source and the drain are separately located in the semiconductor fins on two sides of the metal gate.

16. The field-effect transistor structure of claim 1, wherein the etching-stop layer includes at least one of a silicon oxycarbide $Si_xO_yC_z$, a silicon nitride $Si_xN_y$, a silicon carbide $Si_xC_y$, a silicon carbonitride $Si_xC_yN_z$ or a silicon oxygen carbonitride $Si_xO_yC_zN_w$.

17. The field-effect transistor structure of claim 1, wherein a middle part of the gate contact is in the active region.

18. The field-effect transistor structure of claim 1, wherein two ends of the gate contact are outside the active region.

19. A field-effect transistor structure comprising:
a semiconductor substrate;
a source located in an active region above the semiconductor substrate;
a drain located in the active region above the semiconductor substrate;
a metal gate having a first bottom end located above the active region, wherein the metal gate has a first side and a second side;
a first metal trench associated with the source, wherein the first metal trench is located on the first side of the metal gate and has a second bottom end above a first top end face of the source in the active region;
a second metal trench associated with the drain, wherein the second metal trench is located on the second side of the metal gate and has a third bottom end above a second top end face of the drain in the active region, wherein the second bottom end of the first metal trench and the third bottom end of the second metal trench are at a same height of the first bottom end of the metal gate, and wherein the first top end face of the source and the second top end face of the drain are at a same height of the first bottom end of the metal gate;
an etching-stop layer overlaid on the first metal trench and the second metal trench;
a gate contact located above the metal gate and is at least partially above the active region; and
a semiconductor fin located above the semiconductor substrate, wherein the semiconductor fin and the metal gate are arranged in a cross manner, and wherein the semiconductor fin passes through the metal gate, wherein the gate contact extends from outside the active region to above the active region, and wherein a first part of the gate contact is outside the active region and a second part of the gate contact is in the active region, and wherein the second part that is in the active region does not cross the semiconductor fin.

20. The field-effect transistor structure of claim 19, wherein the active region is a region enclosed by the first metal trench and the second metal trench, wherein a part in which the metal gate and the semiconductor fin intersect is located in the active region.

* * * * *